(12) United States Patent
Wang et al.

(10) Patent No.: US 11,018,207 B2
(45) Date of Patent: May 25, 2021

(54) DISPLAY DEVICE (71) Applicant: BOE TECHNOLOGY GROUP CO., LTD., Beijing (CN)

(72) Inventors: Pinfan Wang, Beijing (CN); Mingche Hsieh, Beijing (CN); Yanjun Chen, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 138 days.

(21) Appl. No.: 16/472,620

(22) PCT Filed: Dec. 3, 2018

(86) PCT No.: PCT/CN2018/118904
§ 371 (c)(1),
(2) Date: Jun. 21, 2019

(87) PCT Pub. No.: WO2019/205636
PCT Pub. Date: Oct. 31, 2019

(65) Prior Publication Data
US 2020/0321410 A1 Oct. 8, 2020

(30) Foreign Application Priority Data
Apr. 28, 2018 (CN) .......................... 201820640331.5

(51) Int. Cl.
*H01L 51/52* (2006.01)
*H01L 27/32* (2006.01)

(52) U.S. Cl.
CPC ...... *H01L 27/3234* (2013.01); *H01L 51/5275* (2013.01)

(58) Field of Classification Search
CPC .................. H01L 27/3234; H01L 51/5275
See application file for complete search history.

(56) References Cited

U.S. PATENT DOCUMENTS

| 6,454,414 B1* | 9/2002 | Ting | H04N 7/144 348/14.07 |
| 2011/0181587 A1* | 7/2011 | Nakamura | H04N 13/383 345/419 |

(Continued)

FOREIGN PATENT DOCUMENTS

| CN | 102136225 A | 7/2011 |
| CN | 106094990 A | 11/2016 |

(Continued)

OTHER PUBLICATIONS

International Search Report and Written Opinion (including English translation of search report and Box V of Written Opinion) for International Application No. PCT/CN2018/118904, dated Mar. 6, 2019, 14 pages.

*Primary Examiner* — Thomas L Dickey
(74) *Attorney, Agent, or Firm* — Westman, Champlin & Koehler, P.A.

(57) ABSTRACT

A display device is provided, including: a display panel including a display face and a first face opposite to the display face; an optical module configured to converge light transmitted through the display panel, the optical module being located on a side of the first face facing away from the display face; and a camera configured to receive light converged by the optical module, the camera located on a side of the optical module facing away from the first face and spaced apart from the optical module, the camera including a light incident face onto which light is incident. A projection of the optical module in a direction perpendicular to the first face of the display panel falls into display area of the display panel, and an area of the projection of the optical module is larger than an area of the light incident face of the camera.

13 Claims, 4 Drawing Sheets

(56) References Cited

U.S. PATENT DOCUMENTS

2013/0278646 A1   10/2013  Nakamura et al.
2016/0035806 A1    2/2016  Park et al.
2017/0092894 A1    3/2017  Yang et al.
2019/0080138 A1    3/2019  Gao et al.

FOREIGN PATENT DOCUMENTS

| CN | 107395809 A | 11/2017 |
| CN | 107515435 A | 12/2017 |
| CN | 107592444 A | 1/2018 |
| CN | 107743198 A | 2/2018 |
| CN | 208027665 U | 10/2018 |
| JP | 2010-230797 A | 10/2010 |
| JP | 2010230797 A * | 10/2010 |

* cited by examiner

DISPLAY DEVICE

CROSS-REFERENCE TO RELATED APPLICATION

This application is a Section 371 National Stage Application of International Application No. PCT/CN2018/118904, filed on Dec. 3, 2018, entitled "DISPLAY DEVICE", which claims the benefit of Chinese Patent Application No. 201820640331.5 filed on Apr. 28, 2018 in the State Intellectual Property Office of China, the whole disclosure of which is incorporated herein by reference.

TECHNICAL FIELD

The present disclosure relates to the field of display technologies, and in particular to a display device having a camera function.

BACKGROUND

At present, a display device with a camera function has become a research hotspot.

SUMMARY

In an aspect, embodiments of the present disclosure provide a display panel including a display face and a first face opposite to the display face; an optical module configured to converge light transmitted through the display panel, the optical module being located on a side of the first face facing away from the display face; and a camera configured to receive light converged by the optical module, the camera being located on a side of the optical module facing away from the first face and spaced apart from the optical module, the camera including a light incident face onto which the light is incident; wherein a projection of the optical module in a direction perpendicular to the first face of the display panel falls into a display area of the display panel, and an area of the projection of the optical module in the direction perpendicular to the first face of the display panel is larger than an area of the light incident face of the camera.

Optionally, the optical module includes a light converging element.

Optionally, the light converging element is a Fresnel lens.

Optionally, the light incident face of the camera is parallel to the Fresnel lens.

Optionally, a face of the Fresnel lens facing the display panel is a flat face, and the light incident face of the camera is parallel to the flat face.

Optionally, a distance between the light incident face of the camera and an optical center of the Fresnel lens in the direction perpendicular to the first face of the display panel is set in such a way that light emitted from a light exit face of the Fresnel lens is substantially totally incident onto the light incident face of the camera.

Optionally, a focal length of the Fresnel lens is equal to R, and the distance between the light incident face of the camera and the optical center of the Fresnel lens in the direction perpendicular to the first face of the display panel is equal to R±10% R.

Optionally, a projection of the camera in the direction perpendicular to the first face of the display panel falls into the display area of the display panel.

Optionally, a projection of the camera in the direction perpendicular to the first face of the display panel falls into the projection of the optical module in the direction perpendicular to the first face of the display panel.

Optionally, the optical module further includes a light deflecting component between the display panel and the light converging element.

Optionally, the light deflecting component includes a prism or a group of mirrors.

Optionally, an area of a projection of the light deflecting component in the direction perpendicular to the first face of the display panel is larger than the area of the light incident face of the camera.

Optionally, the light incident face of the camera is not parallel to the first face of the display panel.

Optionally, the light converging element is a Fresnel lens, a focal length of the Fresnel lens is equal to R, and a distance between the light incident face of the camera and an optical center of the Fresnel lens in the direction perpendicular to the first face of the display panel is less than R.

Optionally, the distance between the light incident face of the camera and the optical center of the Fresnel lens in the direction perpendicular to the first face of the display panel is less than 0.9R.

Optionally, a projection of the camera in the direction perpendicular to the first face of the display panel does not overlap with the projection of the optical module in the direction perpendicular to the first face of the display panel.

DETAILED DESCRIPTION OF EMBODIMENTS

Embodiments of the present disclosure will be described in detail below, and examples of the embodiments are illustrated in the accompanying drawings. The embodiments described below with reference to the drawings are illustrative, and are intended to explain the present disclosure without limiting the present disclosure.

In order to achieve a true full-screen design for mobile terminals, it is critical to handle a space occupied by a front camera. In the related art, in a display device with a camera function, a camera is still located in a non-display area of a display module. For example, some mobile terminals are designed to change a position of the front camera from a top of the terminal to a bottom corner of the terminal. In this way, a screen-to-body ratio at an upper half of a display screen is increased. However, the camera still occupies a certain amount of space on the display screen, so that it is difficult to achieve a true full-screen design.

The Inventor has found through research that the camera is disposed in the display device having the camera function in the related art mainly through the following three manners. In a first manner, the camera is disposed in the non-display area of the display screen, for example, the front camera is disposed at an upper frame of the display screen.

However, it is not possible to achieve a true full-screen design through the first manner. In a second manner, the camera is disposed in a display area of the display screen. However, the light transmittance of the display screen in the existing display device is poor, so that an intensity of light which reaches the camera through the display screen is low, thus an image received by the camera behind the display screen has low definition and poor quality. In a third manner, the camera is disposed in the display area of the display screen, specifically, the display screen has an opening design, that is, a gap is provided between adjacent sub-pixels in the display area, and the camera is located in the gap. Specifically, no other structures, except for a protective substrate and a base substrate, are disposed in the gap, so that the light transmittance at the gap of the display screen is increased. The third manner may increase the light transmittance of the display screen so as to solve the problem of poor image quality, but this manner may reduce the pixel density, resulting in a decrease in the resolution of the display screen, thus resulting in a poor quality of a displayed image.

In other words, the Inventor has found through intensive research and a large number of experiments that the display device having the camera function in the related art has some defects such as inability to achieve true full screen, poor quality of the received image, and low resolution of the display screen.

Figure 1:
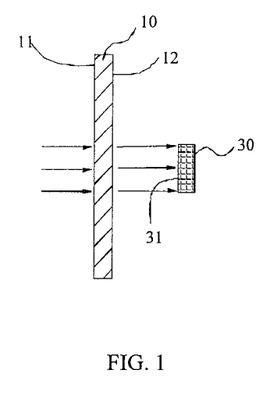
FIG. 1 is a schematic structural view of a display device having a camera function in the related art.

Referring to FIG. 1, a schematic view of a display device having a camera function in the related art is shown. The display device includes a display panel 10 and a camera 30 that may receive light transmitted through the display panel 10. The display panel 10 includes a display face 11 and a first face 12 opposite to the display face 11, and the camera 30 is disposed behind the display panel 10, that is, on a side of the first face 12 facing away from the display face 11. In the display device, the camera 30 may only receive light which is transmitted through a portion of the display panel 10 that is opposite to a light incident face 31 of the camera so as to be incident on the light incident face 31, that is, an area of the portion of the display panel 10, which may be called as a light receiving area of the display panel 10, is equal to an area of the light incident face 31 of the camera. Since the light transmittance of the display panel 10 is low, the overall received light amount is small, so that the received light is weak. As a result, an image received by the camera disposed behind the display screen has low definition and poor quality.

Figure 2:
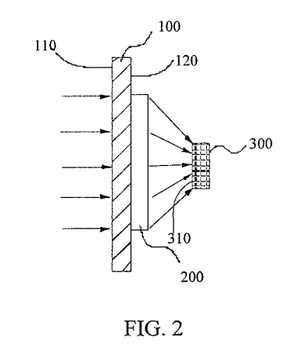
FIG. 2 is a schematic structural view of a display device according to embodiments of the present disclosure.

In one aspect of the present disclosure, embodiments of the present disclosure propose a display device. Referring to FIG. 2, the display device includes: a display panel 100, an optical module 200 that may converge light (e.g., indicated by arrows shown in FIG. 2) transmitted through the display panel, and a camera 300 that may receive light converged by the optical module. In the embodiments according to the present disclosure, the display panel 100 includes a display face 110 and a first face 120 opposite to the display face 110. For example, the display face 110 may be a face of the display panel 100 for displaying information such as text, image and the like, that is, a face facing the user in use of the display panel, and the first face 120 may be a back face of the display panel 100, that is, a face facing away from the user in use of the display panel. The optical module 200 is disposed on a side of the first face 120 facing away from the display face 110. The camera 300 is disposed on a side of the optical module 200 facing away from the first face 120 by an interval, that is, the camera 300 is spaced apart from the optical module 200. In the embodiments according to the present disclosure, an area of an orthographic projection of the optical module 200 on the display panel 100 is larger than an area of a light incident face 310 of the camera 300. Therefore, the display device may realize the camera function while ensuring a normal display, further the optical module in the display device may increase the light receiving area. As the light is converged, both the received light amount and the received light intensity of the camera are significantly increased. In this way, both the definition and the quality of the image obtained by the camera are improved while ensuring the resolution of the display device.

As shown in FIG. 2, a projection of each of the optical module 200 and the camera 300 in a direction perpendicular to the first face 120 of the display panel 100 may fall into the display area of the display panel 100. In other words, the camera may be disposed at a position corresponding to the display area of the display device, so that the camera may receive the image transmitted through the display screen, so that the display device may realize the camera function while ensuring the normal display. It is not necessary to provide an additional space occupying the display screen for the camera, so that a true full-screen design is realized.

In order to facilitate understanding the present disclosure, the principle of the display device for realizing the above technical effects will be described in detail below.

In the display device, the camera 300 is disposed behind the display panel 100, the screen-to-body ratio of the display panel 100 may be significantly increased without making an opening design for the display panel 100 and mounting an additional front camera. Moreover, the camera 300 may receive an image transmitted through the display panel 100, so that the display device may realize the camera function while ensuring the normal display. For example, as the display device is applied into a mobile terminal, it may facilitate a true full-screen design. Further, in the embodiments of the present disclosure, the optical module 200 is added behind the display panel 100. The area of the orthographic projection of the optical module 200 on the display panel 100 is larger than the area of the light incident face of the camera 300, and a projection of the camera 300 in the direction perpendicular to the first face 120 of the display panel 100 falls into a projection of the optical module 200 in the direction perpendicular to the first face 120 of the display panel 100. The optical module 200 may converge light transmitted through the display panel 100, and the light incident face 310 of the camera may totally receive the converged light. If the display panel 100 has the same light transmittance as the display panel 10, a light receiving area of the optical module 200 of the display device (as shown in FIG. 2) according to the embodiments of the present disclosure is much larger than a light receiving area of the camera 30 of the display device (as shown in FIG. 1) in the related art, and the optical module 200 may converge the light so as to significantly increase both the received light amount and the received light intensity of the camera 300, thereby improving both the definition and the quality of the image obtained by the camera 300. In addition, the display device according to the embodiments of the present disclosure may increase the light receiving area, the received light amount and the received light intensity of the camera 300 without increasing the light transmittance of the display panel 100, so that a decrease in the resolution of the display device due to the increase in the light transmittance of the display panel 100 may be avoided. In this way, the display performance of the display device may not be adversely affected.

Further, the display device having the above structures may not only integrate the camera, but also realize an under-screen camera, that is, a component having the camera function may be located at a central position of the screen. Therefore, on one hand, the screen-to-body ratio may be increased; on the other hand, a viewing angle of the camera may be improved with the under-screen camera, for example, an image or the user's eyes may be just opposite to the camera, thereby providing better user experience.

The various components of the display device according to the embodiments of the present disclosure will be described in detail below.

In the embodiments according to the present disclosure, types of the display panel 100 are not particularly limited and may be selected by those skilled in the art according to actual needs. For example, the display panel 100 may include an organic light emitting display (OLED) or a liquid crystal display (LCD).

In some embodiments, the display panel 100 may be an OLED, so that the light transmittance of the display panel is good, and the display device is light and thin due to an absent of a backlight module.

According to some embodiments of the present disclosure, the light transmittance of the display panel 100 is not particularly limited. For example, the light transmittance of the display panel 100 may be in a range of 5% to 70%. Thereby, the performance of the display device may be further improved. The Inventor has found that the optical module 200 disposed in the display device is suitable for the display panel 100 with a light transmittance of 5%-70%. In this way, without a special design for the display panel, the display device may realize the camera function while ensuring a normal display. Further, both the definition and the quality of the image obtained by the camera may be improved while ensuring the display resolution.

Figure 3:
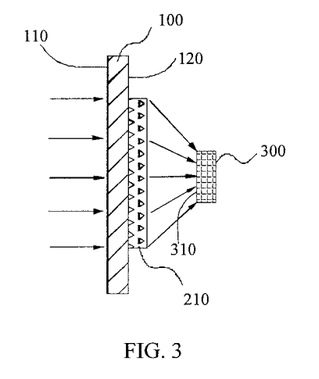
FIG. 3 is a schematic structural view of a display device according to embodiments of the present disclosure.

In some embodiments, referring to FIG. 3, the optical module includes a light converging element 210. Thereby, the light converging element 210 may converge the light so as to converge the light onto the camera 300. In this way, the light receiving area of the camera 300 is increased, and both the received light amount and the received light intensity of the camera 300 are increased, thereby improving both the definition and the quality of the image obtained by camera 300.

According to the embodiments of the present disclosure, specific types of the light converging element 210 are not particularly limited as long as it is capable of converging the light transmitted through the display panel. For example, the light converging element 210 may include a convex lens or a Fresnel lens.

According to the embodiments of the present disclosure, specific types of the camera 300 are not particularly limited and may be selected by those skilled in the art according to actual needs. For example, the camera 300 may include a charge-coupled device (CCD) or a complementary metal oxide semiconductor (CMOS).

In some embodiments, in order to further improve the performance of the display device, the optical module 200 of the display device may further include a light deflecting component 220, that is, the optical module 200 of the display device may include: a light deflecting component 220 and a light converging element 210.

For example, the optical module 200 of the display device may include a light converging element 210. As described above, the specific types of the light converging element 210 are not particularly limited as long as it is capable of converging the light transmitted through the display panel 100. For example, according to the embodiments of the present disclosure, the light converging element 210 may include a convex lens or a Fresnel lens.

Hereinafter, the light converging element will be described in detail as a Fresnel lens.

Figure 4:
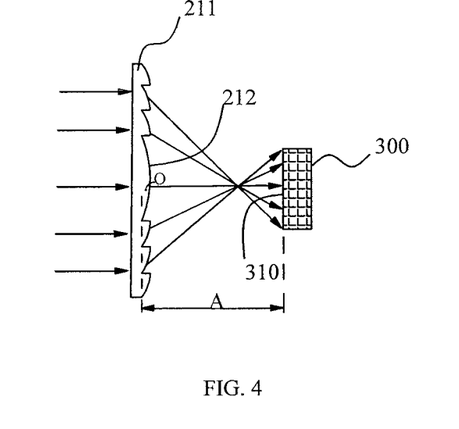
FIG. 4 is a schematic partial structural view of a display device according to embodiments of the present disclosure.

According to specific embodiments of the present disclosure, referring to FIG. 4, the light converging element may be a Fresnel lens 211. The Inventor has found that Fresnel lens has advantages such as large area, small volume, light weight, compact structure and low price, and it has good converging performance and imaging performance, and the transmitted light has high brightness. Further, the Fresnel lens has a flat face which may be bonded to the display panel, so as to further make the display device thin and light. Specifically, a face (left face in FIG. 4) of the Fresnel lens 211 facing the display panel is a flat face, so that it is advantageous to bond the flat face onto the display panel. As shown in FIG. 4, the Fresnel lens 211 may be used to converge light from a relatively large area (left face in FIG. 4) to a relatively small area (right face in FIG. 4). As the Fresnel lens converges the light, the light receiving area, the received light amount and the received light intensity of the camera are all increased, thereby improving both the definition and the quality of the image obtained by the camera. Also, the light converged by the Fresnel lens may maintain brightness throughout the image is uniform, thereby improving the uniformity of the overall brightness and further improving the quality of the image obtained by the camera.

According to the embodiments of the present disclosure, referring to FIG. 4, the camera 300 has a light incident face 310, and the light incident face 310 of the camera is parallel to the Fresnel lens 211, specifically, the light incident face 310 of the camera is parallel to the face of the Fresnel lens 211 facing the display panel. A distance (distance A shown in FIG. 4) between the light incident face 310 of the camera and an optical center of the Fresnel lens (optical center O shown in FIG. 4) is satisfied in such a way that light emitted from a light exit face 212 of the Fresnel lens is substantially totally incident onto the light incident face 310 of the camera 300. It should be noted that an expression "substantially totally" herein should be understood as follows. In theory, the light emitted from the light exit face of the Fresnel lens may be totally incident onto the light incident face of the camera, however, actually, it is possible that not 100% of the light emitted from the light exit face of the Fresnel lens is incident onto the light incident face of the camera due to factors such as a complicated distribution of the light emitted from the Fresnel lens, actually manufacturing process errors and the like, it should be understood that substantially 100% of the light emitted from the light exit face of the Fresnel lens may be incident onto the light incident face of the camera, except interference of these factors. In this way, the camera 300 may substantially totally receive the light converged by the Fresnel lens 211, thereby increasing both the received light amount and the received light intensity and obtaining an image with better definition and better quality.

According to the embodiments of the present disclosure, when the light converging element is a Fresnel lens, an area of an orthographic projection of the Fresnel lens on the display panel is larger than the area of the light incident face of the camera, the Fresnel lens may converge the light transmitted through the display panel, and the camera may receive the converged light, so that the light receiving area is much larger than that in the case where the Fresnel lens is not provided, thereby significantly increasing both the received light amount and the received light intensity of the camera, and improving both the definition and the quality of the image obtained by the camera. In other words, it is not necessary to modify a structure of the display panel 100 (for example, to form a gap by etching a structure between sub-pixels so as to increase the light transmittance), so that the pixel density and the resolution of the display screen may be kept while the under-screen camera may be realized.

For example, the case where the camera 300 is spaced apart from the optical module 200 includes that the camera 300 is spaced apart from the optical module 200 by a predetermined distance. For example, in order to further improve the performance of the display device, according to the embodiments of the present disclosure, referring to FIG. 4, a focal length of the Fresnel lens 211 is equal to R, the distance (distance A shown in FIG. 4) between the camera and the optical center (optical center O shown in FIG. 4) of the Fresnel lens is equal to R±10% R, specifically, the distance (distance A shown in FIG. 4) between the light incident face 310 of the camera and the optical center (optical center O shown in FIG. 4) of the Fresnel lens is equal to R±10% R. The Inventor has found that, by designing the position of the camera, that is, by designing the distance between the camera and the optical center of the Fresnel lens, the light which is transmitted through the display panel and converged by the Fresnel lens is substantially totally converged onto the light incident face of the camera so that the light is totally received by the camera. In this way, the light receiving area is increased, and both the received light amount and the received light intensity are significantly increased. Further, light within a large area may be received with a small camera or a camera having a light incident face of small area, thereby greatly reducing the size of the camera and saving cost.

According to the embodiments of the present disclosure, the thickness of the Fresnel lens 211 is not particularly limited and may be selected by those skilled in the art according to actual needs. For example, according to the embodiments of the present disclosure, the Fresnel lens may have a thickness in a range of 0.05 mm to 2 mm. For example, according to a specific embodiment of the present disclosure, the Fresnel lens 211 has a thickness in a range of 0.5 mm to 0.9 mm. As a result, the Fresnel lens has a small thickness, so that the display device becomes thinner and lighter and the performance of the display device is improved. According to the embodiments of the present disclosure, the light transmittance of the Fresnel lens 211 is not particularly limited and may be selected by those skilled in the art according to actual needs. For example, according to the embodiments of the present disclosure, the Fresnel lens 211 may have a light transmittance greater than 80%. Thereby, an intensity of the light transmitted through the Fresnel lens is high, so that the performance of the display device may be further improved. According to the embodiments of the present disclosure, the refractive index of the Fresnel lens 211 is not particularly limited and may be selected by those skilled in the art according to actual needs. For example, according to the embodiments of the present disclosure, the Fresnel lens 211 may have a refractive index in a range of 1.2 to 1.6. Thereby, the performance of the display device may be further improved. According to the embodiments of the present disclosure, materials forming the Fresnel lens 211 are not particularly limited and may be selected by those skilled in the art according to actual needs. For example, according to the embodiments of the present disclosure, the Fresnel lens 211 may be fabricated using polyvinyl chloride (PVC).

For example, the optical module 200 of the display device may include a light deflecting component and a light converging element. According to the embodiments of the present disclosure, referring to FIG. 5, the optical module 200 includes the light deflecting component 220 and the light converging element 210, and the light deflecting component 220 is disposed between the display panel 100 and the light converging element 210 in a direction in which the light transmitted through the display panel 100 is propagated. The Inventor has found that the light deflecting component 220 may deflect light received by the light deflecting component so as to change a direction in which the light is propagated, and then the deflected light is converged by the light converging element 210, so that the light is converged onto the camera 300. In this way, the thickness of the display device may be reduced.

Figure 5:
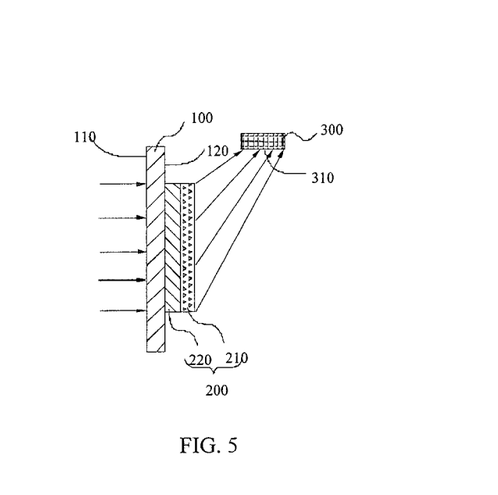
FIG. 5 is a schematic structural view of a display device according to embodiments of the present disclosure.

As described above, when the light deflecting component is absent, the distance (distance A as shown in FIG. 4) between the camera and the optical center of the Fresnel lens satisfies R±10% R so that the light which is converged by the Fresnel lens is guaranteed to be substantially totally received by the camera 300. In other words, in this case, it is necessary to reserve a certain distance between the camera and the light converging element, resulting in an increase in the thickness of the display device. By adding the light deflecting component 220, a propagation path of the light may be changed, so that the light transmitted through the optical module 200 is no longer propagated in a direction perpendicular to the display panel 100. Referring to FIG. 5, the light incident face 310 of the camera is no longer parallel to the display panel 100, but is at an angle relative to the display panel 100. In the embodiments, a reserved distance between the camera and the light converging element is obviously smaller than the distance which is required when the light is propagated in the direction perpendicular to the display panel 100, thereby further reducing the thickness of the display device.

According to the embodiments of the present disclosure, the optical module 200 includes the light deflecting component 220 and the light converging element 210. The light converging element 210 may be the light converging element 210 as described above. Specifically, the light converging element 210 may be a convex lens or a Fresnel lens 211 as described above. Thus, all of the features and advantages as described above may be included and will not be further described herein. More specifically, the optical module 200 of the display device includes the Fresnel lens 211 and the light deflecting component 220. Thereby, the performance of the display device may be further improved.

Detailed description will be provided below by taking an example in which the optical module 200 includes the light deflecting component 220 and the Fresnel lens 211.

According to the embodiments of the present disclosure, an area of an orthographic projection of the light deflecting component 220 on the display panel 100 is larger than the area of the light incident face 310 of the camera. Thereby, both the received light amount and the received light intensity of the camera may be increased, so that both the definition and the quality of the image obtained by the camera may be improved.

According to the embodiments of the present disclosure, the optical module 200 includes the light deflecting component 220 and the Fresnel lens 211, both of which are added behind the display panel having the same light transmittance, and the area of the orthographic projection of each of the light deflecting component and the Fresnel lens on the display panel is larger than the area of the light incident face of the camera. The light deflecting component may deflect light received by the light deflecting component so as to change the direction in which the light is propagated, and then the deflected light is converged by the Fresnel lens, so that the light is converged onto the camera. In this way, the light transmitted through the display panel is converged and the converged light is substantially totally received by the camera. As a result, if the display panels have the same light transmittance, the light receiving area in the display panel having the Fresnel lens is much larger than the light receiving area in the display panel without the Fresnel lens. Further, as the Fresnel lens converges the light, both the received light amount and the received light intensity of the camera are significantly increased, so that both the definition and the quality of the image obtained by the camera are improved.

According to the embodiments of the present disclosure, specific types of the light deflecting component 220 are not particularly limited. For example, according to the embodiments of the present disclosure, the light deflecting component 220 includes a prism or a group of mirrors. Thereby, the performance of the display device may be further improved. The Inventor has found that the prism or the group of mirrors may deflect light received by the prism or the group of mirrors so as to change the direction in which the light is propagated, and then the deflected light is converged by the light converging element, so that the light is converged onto the camera.

According to the embodiments of the present disclosure, the light incident face 310 of the camera may not be parallel to the first face 120 of the display panel 100. In other words, the camera 300 may be placed at any position as long as the camera does not affect the display function and may substantially totally receive the light emitted from the light exit face 212 of the Fresnel lens 211. For example, a projection of the camera 300 in the direction perpendicular to the first face 120 of the display panel 100 does not overlap with a projection of the optical module 200 in the direction perpendicular to the first face 120 of the display panel 100. In the illustrated embodiments, the light deflecting component may be set in such a way that the camera 300 may be disposed on a top side of the display device. The light incident face 310 of the camera may not be parallel to the display panel 100, but may be at an angle relative to the display panel 100. For example, in the illustrated embodiments, the light incident face 310 of the camera is at an approximately 90° angle relative to the first face 120 of the display panel 100.

Figure 6:
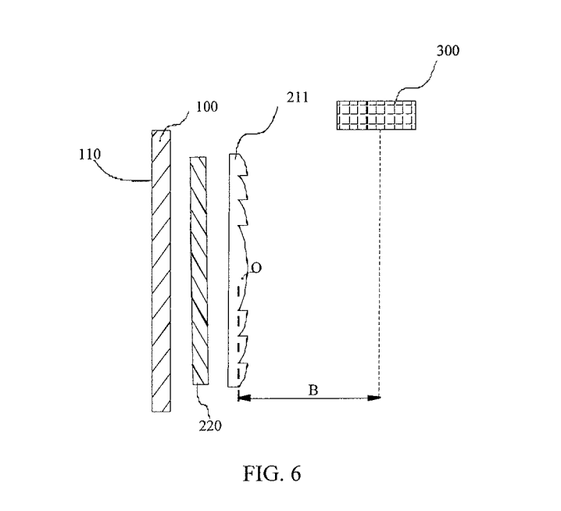
FIG. 6 is an exploded schematic view of the display device shown in FIG. 5.

As shown in FIG. 6, by providing the light deflecting component 220, the distance (distance B shown in FIG. 6) between the camera 300 and the optical center O of the Fresnel lens 211 in the direction perpendicular to the display panel 100 may be less than R, and may even be less than R-10% R. That is to say, the components of the display device may be more compact, so that the thickness of the display device may be further reduced.

It should be noted that positions and angles of optical elements of the optical module shown in the drawings are merely exemplary, and should not be construed as limiting the present disclosure. The positions and angles of optical elements of the optical module may be set as long as the light is deflected by the light deflecting component 220, the deflected light is converged by the light converging element, and the light is converged onto the camera 300.

Therefore, the display device may realize the camera function while ensuring normal display. The optical module of the display device may increase the light receiving area, and both the received light amount and the received light intensity of the camera may be significantly increased, so that both the definition and the quality of the image obtained by the camera are improved while ensuring the resolution of the display device. In the display device according to the above embodiments of the present disclosure, the under-screen camera technology may not only ensure the normal display of the display device, but also realize the camera function of the display device, further, a high-quality image may be obtained with the under-screen camera without reducing the display resolution, thereby greatly enhancing the product competitiveness of the display device having the camera function.

The embodiments of the present disclosure have been described in detail above, but the present disclosure is not limited to the specific details in the above embodiments, and various simple modifications may be made to technical solutions of the present disclosure within the scope of the technical idea of the present disclosure, thus these simple modifications shall be included in the scope of the present disclosure. It should be further noted that specific technical features described in the above specific embodiments may be combined in any suitable manner without contradiction.

In the description of the present disclosure, it is to be understood that orientations or positional relationships indicated by terms such as "upper", "lower", "front", "back", "top", "bottom", "in", "out" and the like are based on the orientations or positional relationships shown in the drawings, and are merely for the convenience of the description of the present disclosure and the simplification of the description, and do not indicate or imply that the device or the component indicated by them necessarily has a specific orientation, is constructed and operated in a specific orientation, and thus they are not to be understood as limiting the present disclosure.

In the description of the present specification, the description with reference to the terms "one embodiment", "some embodiments", "example", "specific example", or "some examples" and the like means a specific feature, structure, material or characteristic described in connection with the embodiment or example is included in at least one embodiment or example of the present disclosure. In the present specification, the schematic description of the above terms is not necessarily directed to the same embodiment or example. Furthermore, the described specific feature, structure, material, or characteristic may be combined in a suitable manner in any one or more embodiments or examples. In addition, various embodiments or examples described in the specification, as well as features in various embodiments or examples, may be combined and united by those skilled in the art without contradiction.

While the embodiments of the present disclosure have been shown and described above, it is to be understood that the foregoing embodiments are illustrative and are not to be construed as limiting the scope of the present disclosure. Those skilled in the art can make changes, modifications, substitutions and variations to these embodiments within the scope of the present disclosure.

What is claimed is:

1. A display device comprising:
 a display panel comprising a display face and a first face opposite to the display face;
 an optical module configured to converge light transmitted through the display panel, the optical module being located on a side of the first face facing away from the display face; and a camera configured to receive light converged by the optical module, the camera being located on a side of the optical module facing away from the first face and spaced apart from the optical module, the camera comprising a light incident face onto which the light is incident;

wherein a projection of the optical module in a direction perpendicular to the first face of the display panel falls into a display area of the display panel, and an area of the projection of the optical module in the direction perpendicular to the first face of the display panel is larger than an area of the light incident face of the camera, wherein the optical module comprises a light converging element, the light converging element is a Fresnel lens, a focal length of the Fresnel lens is equal to R, a distance between the light incident face of the camera and an optical center of the Fresnel lens in the direction perpendicular to the first face of the display panel is equal to R±10% R.

2. The display device of claim 1, wherein the light incident face of the camera is parallel to the Fresnel lens.

3. The display device of claim 2, wherein a face of the Fresnel lens facing the display panel is a flat face, and the light incident face of the camera is parallel to the flat face.

4. The display device of claim 1, wherein a distance between the light incident face of the camera and an optical center of the Fresnel lens in the direction perpendicular to the first face of the display panel is set in such a way that light emitted from a light exit face of the Fresnel lens is substantially totally incident onto the light incident face of the camera.

5. The display device of claim 1, wherein a projection of the camera in the direction perpendicular to the first face of the display panel falls into the display area of the display panel.

6. The display device of claim 1, wherein a projection of the camera in the direction perpendicular to the first face of the display panel falls into the projection of the optical module in the direction perpendicular to the first face of the display panel.

7. The display device of claim 1, wherein the optical module further comprises a light deflecting component between the display panel and the light converging element.

8. The display device of claim 7, wherein the light deflecting component comprises a prism or a group of mirrors.

9. The display device of claim 7, wherein an area of a projection of the light deflecting component in the direction perpendicular to the first face of the display panel is larger than the area of the light incident face of the camera.

10. The display device of claim 7, wherein the light incident face of the camera is not parallel to the first face of the display panel.

11. The display device of claim 7, wherein the light converging element is a Fresnel lens, a focal length of the Fresnel lens is equal to R, and a distance between the light incident face of the camera and an optical center of the Fresnel lens in the direction perpendicular to the first face of the display panel is less than R.

12. The display device of claim 11, wherein the distance between the light incident face of the camera and the optical center of the Fresnel lens in the direction perpendicular to the first face of the display panel is less than 0.9R.

13. The display device of claim 7, wherein a projection of the camera in the direction perpendicular to the first face of the display panel does not overlap with the projection of the optical module in the direction perpendicular to the first face of the display panel.

* * * * *